(12) United States Patent
Huang

(10) Patent No.: US 11,398,510 B2
(45) Date of Patent: Jul. 26, 2022

(54) CROSS-LINE STRUCTURE AND MANUFACTURING METHOD THEREFOR

(71) Applicant: HKC Corporation Limited, Shenzhen (CN)

(72) Inventor: Shishuai Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 31 days.

(21) Appl. No.: 17/043,563

(22) PCT Filed: Nov. 29, 2018

(86) PCT No.: PCT/CN2018/118066
§ 371 (c)(1),
(2) Date: Sep. 29, 2020

(87) PCT Pub. No.: WO2020/093486
PCT Pub. Date: May 14, 2020

(65) Prior Publication Data
US 2021/0028198 A1  Jan. 28, 2021

(30) Foreign Application Priority Data
Nov. 7, 2018  (CN) .......................... 201811318114.5

(51) Int. Cl.
*H01L 27/12* (2006.01)
*G02F 1/1362* (2006.01)
*G02F 1/1337* (2006.01)

(52) U.S. Cl.
CPC .... *H01L 27/1259* (2013.01); *G02F 1/136286* (2013.01); *H01L 27/124* (2013.01); *G02F 1/13629* (2021.01); *G02F 1/133796* (2021.01)

(58) Field of Classification Search
CPC ............. H01L 27/1259; H01L 27/1255; H01L 27/3276; H01L 23/5226; H01L 23/528;
(Continued)

(56) References Cited

U.S. PATENT DOCUMENTS

2009/0295696 A1   12/2009   Uehara
2016/0013281 A1*  1/2016   Kim ................. H01L 29/41733
                                                                   257/72
2016/0190172 A1*  6/2016   Liu ..................... H01L 27/1255
                                                                   257/72

FOREIGN PATENT DOCUMENTS

CN          204679743 U       9/2015
CN          104977736 A       10/2015
(Continued)

OTHER PUBLICATIONS

English Translation of the International Search Report dated Jul. 29, 2019, issued in corresponding International Application No. PCT/CN2018/118066, filed Nov. 29, 2018, 2 pages.
(Continued)

*Primary Examiner* — Xuemei Zheng
(74) *Attorney, Agent, or Firm* — Hauptman Ham, LLP

(57) ABSTRACT

A method for manufacturing a cross-line structure includes the steps of etching to obtain a first conductive layer, depositing a second conductive material and a photoresist material on the first conductive layer, and removing the part of the photoresist material on a position where a second conductive layer is not required by means of a photomask. The method further includes the steps of etching the second conductive material, obtaining the second conductive layer, and performing compensation on a photomask graphic so that the width of an overlap portion of the second conductive layer with the first conductive layer is greater than or equal to the width of the portion of the second conductive layer that does not overlap the first conductive layer.

16 Claims, 5 Drawing Sheets

(58) Field of Classification Search
CPC ......... H01L 23/5283; H01L 21/823437; H01L 21/823475; H01L 21/266; H01L 21/31144; H01L 21/32139; H01L 21/0465; H01L 21/31116; H01L 27/124; G02F 1/13629; G02F 1/136295; G02F 1/136286; G02F 1/133796
See application file for complete search history.

(56) References Cited

FOREIGN PATENT DOCUMENTS

| | | | |
|---|---|---|---|
| CN | 106155420 A | | 11/2016 |
| CN | 107230661 A | | 10/2017 |
| CN | 107425012 A | | 12/2017 |
| CN | 106229320 B | * | 4/2019 |

OTHER PUBLICATIONS

Chinese Office Action dated Jan. 6, 2020, issued in corresponding CN Application No. 201811318114.5, filed Nov. 7, 2018, 8 pages.

* cited by examiner

CROSS-LINE STRUCTURE AND MANUFACTURING METHOD THEREFOR

TECHNICAL FIELD

This application relates to the display field, and in particular, to a jumper structure and a manufacturing method therefor.

BACKGROUND

The description herein provides only background information related to this application but does not necessarily constitute the existing technology.

In the industry of display panels, there are millions of track designs for different functions and different layers in a panel. Jumper overlap may appear at a massive number of locations between tracks.

By using a liquid crystal display as an example, generally, at a jumper portion between an upper layer lead layer and a lower layer lead layer, a membrane thickness of the upper layer lead layer at a ramp angle, when plating the upper layer lead layer, is less than that of the upper layer lead layer at a non-jumper planar portion because the lower layer lead layer has a thickness and a ramp angle. After the upper layer lead layer is plated, photoresist plating needs to be performed. Due to the leveling property of a photoresist, a membrane thickness of the photoresist above the ramp angle and a jumper metal is less than that of the photoresist at the non-jumper planar portion. During exposure, a photoresist retained at a position where the photoresist is thin is slender. During etching, more part of a portion below a slender photoresist is etched by an acid, further, the upper layer lead layer at an upper position of a ramp has a thinner coating and is apt to be etched by an acid to become slender, and in a severe case, the photoresist may be broken, resulting in abnormality in signal transmission and reduction in the quality of the panel.

SUMMARY

Embodiments of this application provide a method of manufacturing a jumper structure, comprising:

providing a substrate, depositing a first conductive substance on the substrate, and etching the first conductive substance to obtain a first conductive layer;

depositing a second conductive substance and a photoresist substance sequentially on the first conductive layer;

removing, by using a mask, a part of photoresist substance at a position where no second conductive layer needs to be formed;

etching the second conductive substance by using a part of unetched photoresist substance as a barrier layer; and removing the part of unetched photoresist substance to obtain the second conductive layer, the second conductive layer overlapping the first conductive layer, wherein a pattern of the mask is compensated so that a width of an overlapping portion of the second conductive layer with the first conductive layer is greater than or equal to that of a non-overlapping portion of the second conductive layer with the first conductive layer.

In an embodiment, a structure of the part of unetched photoresist substance, as the barrier layer, comprises a planar segment M1, a ramp segment P1, a planar segment M2, a ramp segment P2, and a planar segment M3 that are connected sequentially, the ramp segment P1, the planar segment M2, and the ramp segment P2 are located in a projection overlapping portion of the first conductive layer and the second conductive layer, a width of the ramp segment P1 is greater than that of the planar segment M1, of the planar segment M2, and of the planar segment M3, respectively, and a width of the ramp segment P2 is greater than that of the planar segment M1, of the planar segment M2, and of the planar segment M3, respectively.

In an embodiment, the width of the planar segment M1 is less than that of the planar segment M2 and the width of the planar segment M3 is less than that of the planar segment M2.

In an embodiment, a structure of the first conductive layer comprises a planar segment M4, a planar segment M5, and a planar segment M6 that are connected sequentially, a width of the planar segment M5 is less than that of the planar segment M4 and of the planar segment M6, respectively, and the planar segment M5 is located in a projection overlapping portion of the first conductive layer and the second conductive layer.

In an embodiment, before depositing a first conductive substance on the substrate and etching the first conductive substance to obtain a first conductive layer, the method further comprises: depositing a buffer layer on the substrate.

In an embodiment, the buffer layer comprises a silicon oxide layer or a silicon nitride layer.

In an embodiment, the buffer layer comprises a composite layer of superposed silicon oxide and silicon nitride.

In an embodiment, the substrate comprises a glass substrate or a flexible substrate.

In an embodiment, removing, by using a mask, a part of photoresist substance at a position where no second conductive layer needs to be formed comprises:

covering, by the mask, a position where the second conductive layer needs to be formed;

dissolving, by lighting, the photoresist substance at the position where no second conductive layer needs to be formed in a photoresist developing solution; and removing, by using a photoresist stripping solution, the part of photoresist substance at the position where no second conductive layer needs to be formed.

In an embodiment, a method for depositing the first conductive substance comprises magnetron sputtering or substance physical vapor deposition.

In an embodiment, a method for depositing the second conductive substance comprises chemical vapor deposition.

In an embodiment, the first conductive layer is a first metal layer and the second conductive layer is a second metal layer.

In an embodiment, the first conductive layer is a first metal layer and the second conductive layer is an indium tin oxide layer.

In an embodiment, the first metal layer and the second metal layer comprise an aluminum layer, a molybdenum layer, or a copper layer.

In an embodiment, the first conductive layer is configured to form a gate track and the second conductive layer is configured to form source and drain tracks.

In an embodiment, the first conductive layer is disposed perpendicular to the second conductive layer.

An embodiment of this application further provides method of manufacturing a jumper structure, comprising:

providing a substrate, depositing a first conductive substance on the substrate, and etching the first conductive substance to obtain a first conductive layer, the first conductive layer being configured to form a gate track;

depositing a second conductive substance and a photoresist substance sequentially on the first conductive layer;

removing, by using a mask, a part of photoresist substance at a position where no second conductive layer needs to be formed;

etching the second conductive substance by using a part of unetched photoresist substance as a barrier layer; and removing the part of unetched photoresist substance to obtain the second conductive layer, the second conductive layer being configured to form source and drain tracks, and the second conductive layer being disposed perpendicular to the first conductive layer, wherein a pattern of the mask is compensated so that a width of an overlapping portion of the second conductive layer with the first conductive layer is greater than or equal to that of a non-overlapping portion of the second conductive layer with the first conductive layer.

An embodiment of this application further provides a jumper structure, wherein the jumper structure is manufactured by using the above method of manufacturing a jumper structure.

By using the above method of manufacturing a jumper structure, by compensating the pattern of the mask so that the width of the overlapping portion of the second conductive layer with the first conductive layer is greater than or equal to that of the non-overlapping portion of the second conductive layer with the first conductive layer, the following problems are resolved: the membrane thickness of the upper layer lead layer at the ramp angle, when plating the upper layer lead layer, is less than that of the upper layer lead layer at the non-jumper planar portion because the lower layer lead layer has a thickness and a ramp angle; the membrane thickness of the photoresist above the ramp angle and the jumper metal, when performing photoresist plating after the upper layer lead layer is plated, is less than that of the photoresist at the non-jumper planar portion due to the leveling property of the photoresist; during exposure, a photoresist retained at a position where the photoresist is thin is slender; and during etching, more part of a conductive layer below a slender photoresist is etched by an acid, further, the upper layer lead layer at an upper position of a ramp has a thinner coating and is apt to be etched by an acid to become slender, and in a severe case, the photoresist may be broken, resulting in abnormality in signal transmission.

DESCRIPTION OF THE DRAWINGS

To describe the technical solutions of the embodiments of this application or the existing technology more clearly, the following briefly introduces the accompanying drawings required for describing the embodiments or the existing technology. The accompanying drawings in the following description show only some embodiments of the present application, and persons of ordinary skill in the art may still derive other drawings from these accompanying drawings without creative efforts.

DETAILED DESCRIPTION

When an element is considered to be "connected" to another element, it may be directly connected the to another element or there may exist an intermediate element. Unless otherwise defined, all technical and scientific terms used herein have the same meaning as commonly understood by persons skilled in the art to which this application pertains. The terminology used in the description of this application herein is for describing particular embodiments only and is not intended to be limiting of this application.

Figure 1:
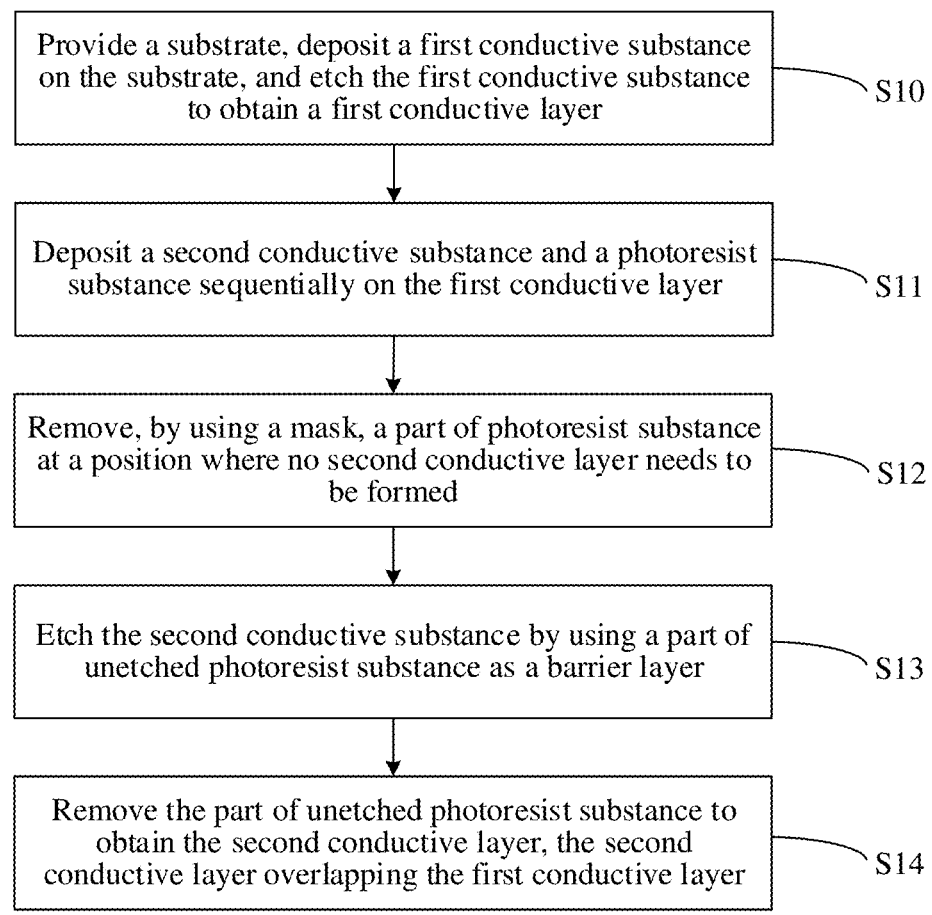
FIG. 1 is a flowchart of a method of manufacturing a jumper structure according to an embodiment.

Referring to FIG. 1, a flowchart of a method of manufacturing a jumper structure according to an embodiment is shown.

A method of manufacturing a jumper structure includes:

step S10: Provide a substrate, deposit a first conductive substance on the substrate, and etch the first conductive substance to obtain a first conductive layer. Specifically, the substrate includes a glass substrate or a flexible substrate.

Further, before step S10, the method further includes the step of depositing a buffer layer on the substrate. The buffer layer may be a silicon oxide layer, a silicon nitride layer, or a composite layer of superposed silicon oxide and silicon nitride. The main objective of the buffer layer is to prevent impurities contained in the substrate 100 from migrating to the first metal layer.

Further, a method for depositing the first conductive substance includes magnetron sputtering or substance physical vapor deposition.

Figure 2:
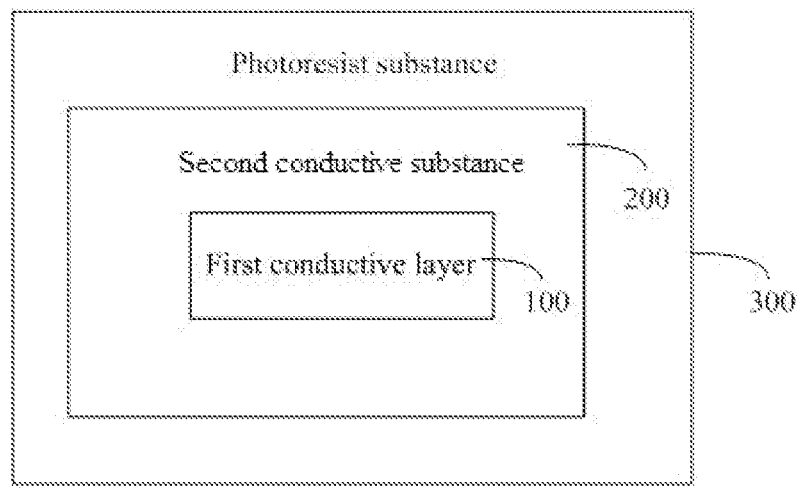
FIG. 2 is a structural top view of step S11 according to an embodiment.

Referring to FIG. 2, a structural top view of step S11 according to an embodiment is shown. Step S11: Deposit a second conductive substance 200 and a photoresist substance 300 sequentially on the first conductive layer 100. Specifically, the deposited photoresist substance 300 completely covers the second conductive substance 200 and the deposited second conductive substance 200 completely covers the first conductive layer 100. The photoresist substance may be a positive photoresist or a negative photoresist.

Figure 3:
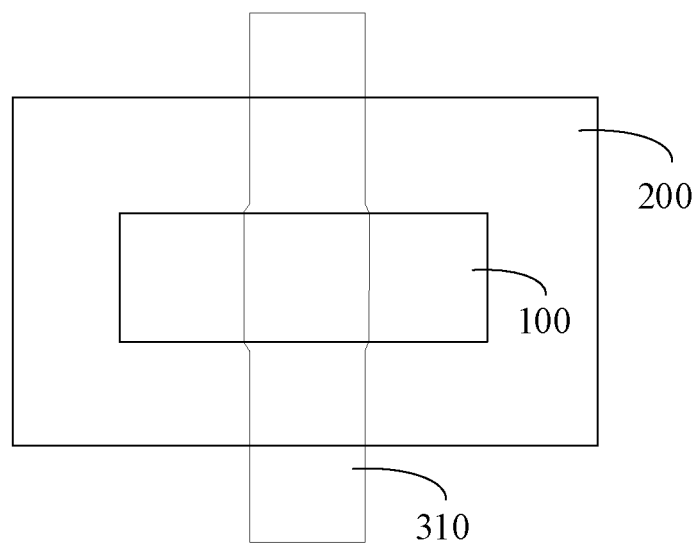
FIG. 3 is a structural top view of step S12 according to an embodiment.

Referring to FIG. 3, a structural top view of step S12 according to an embodiment is shown. Step S12: Remove, by using a mask, a part of photoresist substance at a position where no second conductive layer needs to be formed.

Specifically, when the photoresist substance 300 used in this embodiment is a positive photoresist, a position where a second conductive layer needs to be formed is covered by the mask, the photoresist substance at the position where no second conductive layer needs to be formed is dissolved in a photoresist developing solution by lighting, and meanwhile, the part of photoresist substance at the position where no second conductive layer needs to be formed is removed by using a photoresist stripping solution.

Figure 4:
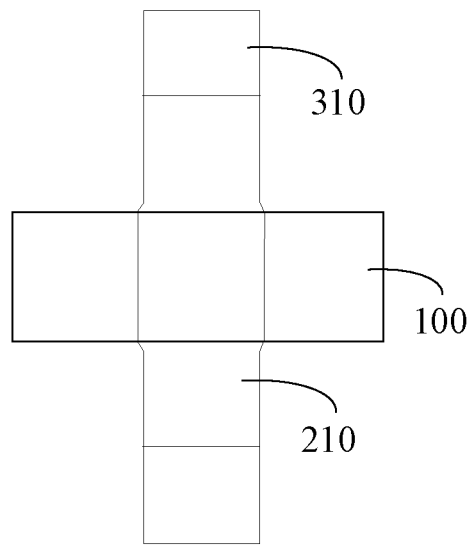
FIG. 4 is a structural top view of step S13 according to an embodiment.

Referring to FIG. 4, a structural top view of step S13 according to an embodiment is shown. Step S13: Etch the second conductive substance 200 by using a part of unetched photoresist substance 310 as a barrier layer. Specifically, the second conductive substance exposed after the part of the photoresist substance is etched is etched by using the part of unetched photoresist substance 310 as the barrier layer.

Figure 5:
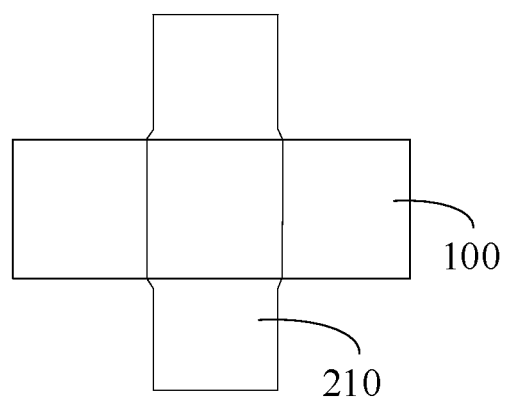
FIG. 5 is a structural top view of step S14 according to an embodiment.

Referring to FIG. 5, a structural top view of step S14 according to an embodiment is shown. Step S14: Remove the part of unetched photoresist substance 310 to obtain the second conductive layer 210, the second conductive layer 210 overlapping the first conductive layer 100. By reacting with light, the part of unetched photoresist substance 310 is removed to obtain the second conductive layer 210.

Figure 6:
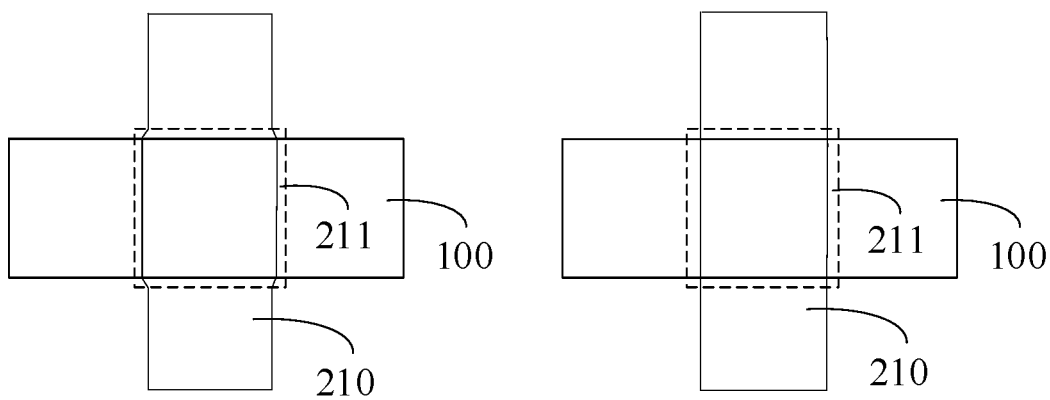
FIG. 6 is a structural top view of step S15 according to another embodiment.

Referring to FIG. 6, a structural top view of step S15 according to another embodiment is shown. Step S15: Compensate a pattern of the mask so that a width of an overlapping portion 211 of the second conductive layer 210 with the first conductive layer 100 is greater than or equal to that of a non-overlapping portion of the second conductive layer 210 with the first conductive layer 100.

By using the above method of manufacturing a jumper structure, by compensating the pattern of the mask so that the width of the overlapping portion 211 of the second conductive layer 210 with the first conductive layer 100 is greater than or equal to that of the non-overlapping portion of the second conductive layer with the first conductive layer 100, the follow problems are resolved: the membrane thickness of the upper layer lead layer at the ramp angle, when plating the upper layer lead layer, is less than that of the upper layer lead layer at the non-jumper planar portion because the lower layer lead layer has a thickness and a ramp angle; the membrane thickness of the photoresist above the ramp angle and the jumper metal, when performing photoresist plating after the upper layer lead layer is plated, is less than that of the photoresist at the non-jumper planar portion due to the leveling property of the photoresist; during exposure, a photoresist retained at a position where the photoresist is thin is slender; and during etching, more part of a conductive layer below a slender photoresist is etched by an acid, further, the upper layer lead layer at an upper position of a ramp has a thinner coating and is apt to be etched by an acid to become slender, and in a severe case, the photoresist may be broken, resulting in abnormality in signal transmission.

Figure 7:
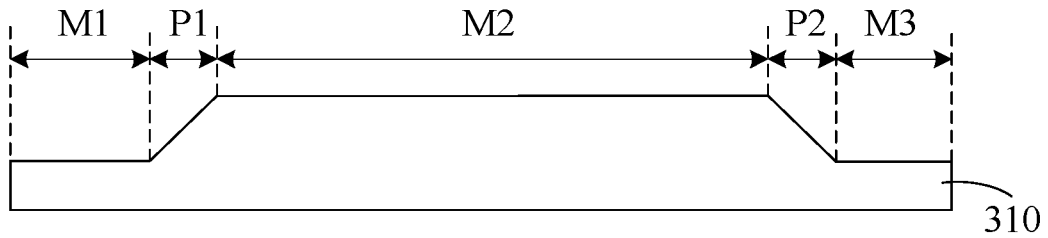
FIG. 7 is a vertical sectional view of a part of unetched photoresist substance according to an embodiment.
Figure 8A:
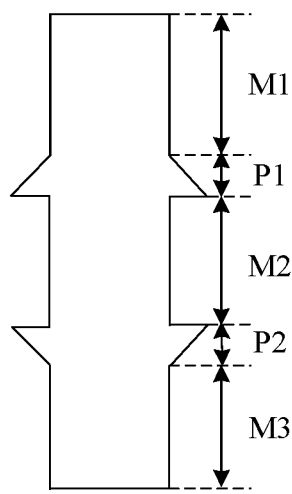
FIG. 8a is a top view of a part of unetched photoresist substance according to an embodiment.

In an embodiment, referring to FIG. 7, a vertical sectional view of a part of unetched photoresist substance according to an embodiment is shown. A structure of the part of unetched photoresist substance 310, as the barrier layer, includes a planar segment M1, a ramp segment P1, a planar segment M2, a ramp segment P2, and a planar segment M3 that are connected sequentially. Referring to FIG. 8a, a top view of a part of unetched photoresist substance according to an embodiment is shown. The ramp segment P1, the planar segment M2, and the ramp segment P2 are located where projections of the first conductive layer 100 and the second conductive layer 210 overlap. A width of the ramp segment P1 is greater than that of the planar segment M1, of the planar segment M2, and of the planar segment M3, respectively, and a width of the ramp segment P2 is greater than that of the planar segment M1, of the planar segment M2, and of the planar segment M3, respectively. The widening design of the ramp segment P1 and the ramp segment P2 can resolve the problems: that the second conductive layer 210 and the photoresist substance deposited on the ramp angle is excessively thin and during etching, more part of the photoresist substance on the ramp angle is etched, resulting in that the second conductive layer 210 on the ramp angle becomes slender, and causing wire break. Therefore, by compensating the pattern of the mask and widening the width of the photoresist substance on the second conductive layer 210 at the ramp segment, the problem of wire break during etching caused by that the second conductive layer 210 on the ramp is excessively thin can be alleviated.

Figure 8B:
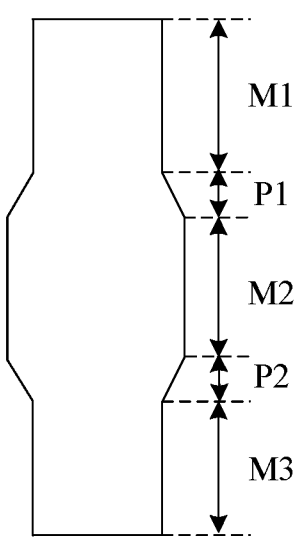
FIG. 8b is a top view of a part of unetched photoresist substance according to another embodiment.

In an embodiment, referring to FIG. 8b, a top view of a part of unetched photoresist substance according to another embodiment is shown. The width of the planar segment M1 is less than that of the planar segment M2 and the width of the planar segment M3 is less than that of the planar segment M2. In this embodiment, by widening the planar segment M2 of the part of unetched photoresist substance by compensating the pattern of the mask, that is, by widening the planar segment M2, the ramp segment P1, and the ramp segment P2 at the same time, the problem of wire break during etching caused by that the second conductive layer 210 on the ramp is excessively thin can be alleviated can also be alleviated.

Figure 9:
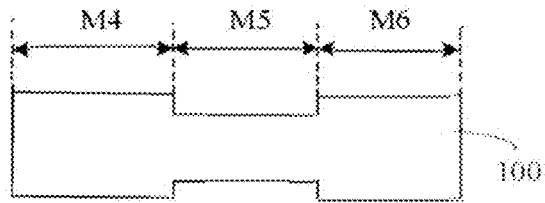
FIG. 9 is a top view of a first conductive layer according to an embodiment.

Further, referring to FIG. 9, a top view of a first conductive layer 100 according to an embodiment is shown. A structure of the first conductive layer 100 includes a planar segment M4, a planar segment M5, and a planar segment M6 that are connected sequentially. A width of the planar segment M5 is less than that of the planar segment M4 and of the planar segment M6, respectively, and the planar segment M5 is located in a projection overlapping portion of the first conductive layer 100 and the second conductive layer 210. The second conductive layer 210 above the projection overlapping portion is designed to be planar and wide, and therefore a capacitance at the overlapping portion is large. By reducing the width of the first conductive layer at the overlapping portion, the impact of capacitance increase caused by that the width of the second conductive layer at the overlapping portion is excessively large can be avoided.

Further, the first conductive layer 100 is a first metal layer, and the second conductive layer 210 is a second metal layer or an indium tin oxide layer. Materials of the first metal layer 100 and the second metal layer 210 include aluminum, copper, titanium, tungsten, molybdenum, and at least one of the combinations of the above metals, and the first conductive layer 100 and the second conductive layer 210 are of a dual-layer structure, thereby being capable of effectively reducing an impedance of the tracks.

Specifically, the first conductive layer 100 is configured to form a gate track, and the second conductive layer 210 is configured to form source and drain tracks. A thin film transistor includes a gate electrode, a source electrode, and a drain electrode. Therefore, the first conductive layer 100 can be configured to form the gate electrode, and the second conductive layer 210 can be configured to form the source electrode and the drain electrode.

Specifically, the first conductive layer 100 is disposed perpendicular to the second conductive layer 210. The first conductive layer 100 is disposed perpendicular to the second conductive layer 210, and loss of the jumper structure during signal transmission is reduced effectively by reducing a length of a transmission lead.

Figure 10:
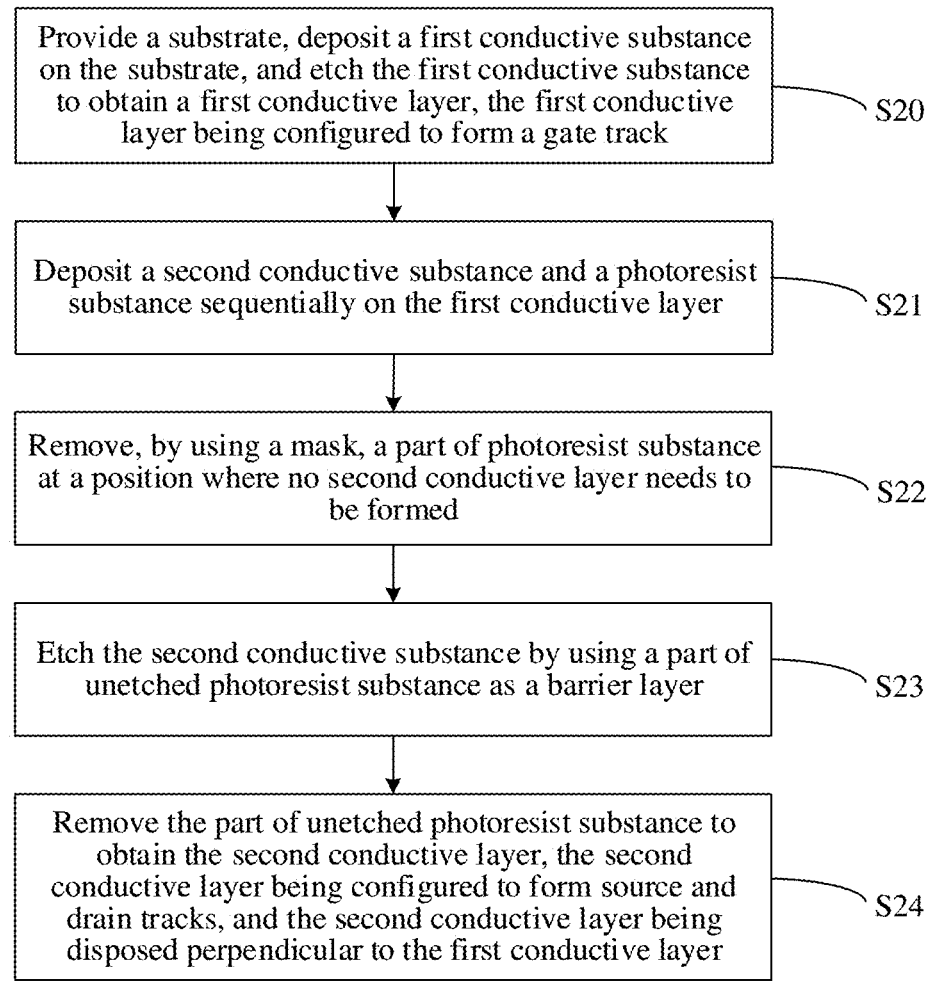
FIG. 10 is a flowchart of a method of manufacturing a jumper structure according to another embodiment.

Referring to FIG. 10, a flowchart of a method of manufacturing a jumper structure according to another embodiment is shown.

A method of manufacturing a jumper structure includes:

Step S20: Provide a substrate, deposit a first conductive substance on the substrate, and etch the first conductive substance to obtain a first conductive layer, the first conductive layer being configured to form a gate track.

Step S21: Deposit a second conductive substance and a photoresist substance sequentially on the first conductive layer.

Step S22: Remove, by using a mask, a part of photoresist substance at a position where no second conductive layer needs to be formed.

Step S23: Etch the second conductive substance by using a part of unetched photoresist substance as a barrier layer.

Step S24: Remove the part of unetched photoresist substance to obtain the second conductive layer, the second conductive layer being configured to form source and drain tracks, and the second conductive layer being disposed perpendicular to the first conductive layer.

Step S25: Compensate a pattern of the mask so that a width of an overlapping portion of the second conductive layer with the first conductive layer is greater than or equal to that of a non-overlapping portion of the second conductive layer with the first conductive layer.

By using the above method of manufacturing a jumper structure, by compensating the pattern of the mask so that the width of the overlapping portion 211 of the second conductive layer 210 with the first conductive layer 100 is greater than or equal to that of the non-overlapping portion of the second conductive layer with the first conductive layer 100, the following problems are resolved: the membrane thickness of the upper layer lead layer at the ramp angle, when plating the upper layer lead layer, is less than that of the upper layer lead layer at the non-jumper planar portion because the lower layer lead layer has a thickness and a ramp angle; the membrane thickness of the photoresist above the ramp angle and the jumper metal, when performing photoresist plating after the upper layer lead layer is plated, is less than that of the photoresist at the non-jumper planar portion due to the leveling property of the photoresist; during exposure, a photoresist retained at a position where the photoresist is thin is slender; and during etching, more part of a conductive layer below a slender photoresist is etched by an acid, further, the upper layer lead layer at an upper position of a ramp has a thinner coating and is apt to be etched by an acid to become slender, and in a severe case, the photoresist may be broken, resulting in abnormality in signal transmission.

Provided is a jumper structure. The jumper structure is manufactured by using the above method of manufacturing a jumper structure.

The jumper structure is manufactured by using the above method of manufacturing a jumper structure, thereby effectively resolving the problem of signal transmission abnormality caused by wire break of the jumper structure.

Technical features in the foregoing embodiments may be combined randomly. For the brevity of description, not all possible combinations of various technical features in the foregoing embodiments are described. However, as long as combinations of these technical features do not contradict each other, it should be considered that the combinations all fall within the scope of this specification.

The foregoing embodiments only show several implementations of this application and are described in detail, but they should not be construed as a limit to the patent scope of this application. It should be noted that, a person of ordinary skill in the art may make various changes and improvements without departing from the ideas of this application, which shall all fall within the protection scope of this application. Therefore, the protection scope of the patent of this application shall be subject to the appended claims.

What is claimed is:

1. A method of manufacturing a jumper structure, comprising:

providing a substrate, depositing a first conductive substance on the substrate, and etching the first conductive substance to obtain a first conductive layer;

depositing a second conductive substance and a photoresist substance sequentially on the first conductive layer;

removing, by using a mask, a part of photoresist substance at a position where no second conductive layer needs to be formed;

etching the second conductive substance by using a part of the photoresist substance which is unetched as a barrier layer; and removing the part of the photoresist substance which is unetched to obtain the second conductive layer, the second conductive layer overlapping the first conductive layer, wherein a width of an overlapping portion of the second conductive layer with the first conductive layer is greater than or equal to that of a non-overlapping portion of the second conductive layer with the first conductive layer;

wherein a structure of the part of the photoresist substance which is unetched, as the barrier layer, comprises a planar segment M1, a ramp segment P1, a planar segment M2, a ramp segment P2, and a planar segment M3 that are connected sequentially, the ramp segment P1, the planar segment M2, and the ramp segment P2 are located in a projection overlapping portion of the first conductive layer and the second conductive layer, a width of the ramp segment P1 is greater than that of the planar segment M1, of the planar segment M2, and of the planar segment M3, respectively, and a width of the ramp segment P2 is greater than that of the planar segment M1, of the planar segment M2, and of the planar segment M3, respectively;

wherein the width of the ramp segment P1 is increasing from a side of the ramp segment P1 close to the planar segment M1 to a side of the ramp segment P1 close to the planar segment M2, and the width of the ramp segment P2 is increasing from a side of the ramp segment P2 close to the planar segment M3 to a side of the ramp segment P2 close to the planar segment M2.

2. The method according to claim 1, wherein a structure of the first conductive layer comprises a planar segment M4, a planar segment M5, and a planar segment M6 that are connected sequentially, a width of the planar segment M5 is less than that of the planar segment M4 and of the planar segment M6, respectively, and the planar segment M5 is located in the projection overlapping portion of the first conductive layer and the second conductive layer.

3. The method according to claim 1, wherein before depositing a first conductive substance on the substrate and etching the first conductive substance to obtain a first conductive layer, the method further comprises: depositing a buffer layer on the substrate.

4. The method according to claim 3, wherein the buffer layer comprises a silicon oxide layer or a silicon nitride layer.

5. The method according to claim 3, wherein the buffer layer comprises a composite layer of superposed silicon oxide and silicon nitride.

6. The method according to claim 1, wherein the substrate comprises a glass substrate or a flexible substrate.

7. The method according to claim 1, wherein removing, by using a mask, a part of photoresist substance at a position where no second conductive layer needs to be formed comprises:

covering, by the mask, a position where the second conductive layer needs to be formed;

dissolving, by lighting, the photoresist substance at the position where no second conductive layer needs to be formed in a photoresist developing solution; and removing, by using a photoresist stripping solution, the part of photoresist substance at the position where no second conductive layer needs to be formed.

8. The method according to claim 1, wherein a method for depositing the first conductive substance comprises magnetron sputtering or substance physical vapor deposition.

9. The method according to claim 1, wherein the first conductive layer and the second conductive layer are of a dual-layer structure.

10. The method according to claim 1, wherein the first conductive layer is a first metal layer and the second conductive layer is a second metal layer.

11. The method according to claim 10, wherein the first metal layer and the second metal layer comprise an aluminum layer, a molybdenum layer, or a copper layer.

12. The method according to claim 1, wherein the first conductive layer is a first metal layer and the second conductive layer is an indium tin oxide layer.

13. The method according to claim 1, wherein the first conductive layer is configured to form a gate track and the second conductive layer is configured to form source and drain tracks.

14. The method according to claim 1, wherein the first conductive layer is disposed perpendicular to the second conductive layer.

15. A jumper structure, wherein the jumper structure is manufactured by using the method according to claim 1.

16. A method of manufacturing a jumper structure, comprising:

providing a substrate, depositing a first conductive substance on the substrate, and etching the first conductive substance to obtain a first conductive layer, the first conductive layer being configured to form a gate track;

depositing a second conductive substance and a photoresist substance sequentially on the first conductive layer;

removing, by using a mask, a part of photoresist substance at a position where no second conductive layer needs to be formed;

etching the second conductive substance by using a part of the photoresist substance which is unetched as a barrier layer; and removing the part of the photoresist substance which is unetched to obtain the second conductive layer, the second conductive layer being configured to form source and drain tracks, and the second conductive layer being disposed perpendicular to the first conductive layer, wherein a width of an overlapping portion of the second conductive layer with the first conductive layer is greater than or equal to that of a non-overlapping portion of the second conductive layer with the first conductive layer;

wherein a structure of the part of the photoresist substance which is unetched, as the barrier layer, comprises a planar segment M1, a ramp segment P1, a planar segment M2, a ramp segment P2, and a planar segment M3 that are connected sequentially, the ramp segment P1, the planar segment M2, and the ramp segment P2 are located in a projection overlapping portion of the first conductive layer and the second conductive layer, a width of the ramp segment P1 is greater than that of the planar segment M1, of the planar segment M2, and of the planar segment M3, respectively, and a width of the ramp segment P2 is greater than that of the planar segment M1, of the planar segment M2, and of the planar segment M3, respectively;

wherein the width of the ramp segment P1 is increasing from a side of the ramp segment P1 close to the planar segment M1 to a side of the ramp segment P1 close to the planar segment M2, and the width of the ramp segment P2 is increasing from a side of the ramp segment P2 close to the planar segment M3 to a side of the ramp segment P2 close to the planar segment M2.

* * * * *